US009799546B2

(12) United States Patent
Matsuda

(10) Patent No.: US 9,799,546 B2
(45) Date of Patent: Oct. 24, 2017

(54) SEMICONDUCTOR MANUFACTURING APPARATUS AND METHOD OF OPERATING THE SAME

(71) Applicant: Toshiba Memory Corporation, Minato-ku (JP)

(72) Inventor: Yuya Matsuda, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/018,912

(22) Filed: Feb. 9, 2016

(65) Prior Publication Data

US 2017/0062259 A1    Mar. 2, 2017

(30) Foreign Application Priority Data

Aug. 28, 2015  (JP) ................................. 2015-169673

(51) Int. Cl.

| H01L 21/00 | (2006.01) |
|---|---|
| H01L 23/58 | (2006.01) |
| H01L 21/683 | (2006.01) |
| H01L 21/308 | (2006.01) |
| H01L 21/66 | (2006.01) |
| H01L 21/67 | (2006.01) |

(52) U.S. Cl.
CPC ........ H01L 21/6833 (2013.01); H01L 21/308 (2013.01); H01L 21/67253 (2013.01); H01L 22/14 (2013.01)

(58) Field of Classification Search
USPC ......... 438/7, 9, 10, 254, 714, 710, 758, 723, 438/771; 216/79, 58, 60, 67; 257/48
See application file for complete search history.

(56) References Cited

U.S. PATENT DOCUMENTS

| 5,467,249 A | 11/1995 | Barnes et al. |
|---|---|---|
| 6,198,616 B1 | 3/2001 | Dahimene et al. |
| 8,277,673 B2 | 10/2012 | Tsujimoto et al. |
| 2006/0037703 A1* | 2/2006 | Koshiishi .......... H01J 37/32082 156/345.47 |
| 2012/0250213 A1* | 10/2012 | Yamawaku ......... H01L 21/6833 361/234 |

(Continued)

FOREIGN PATENT DOCUMENTS

| JP | 7-201960 | 8/1995 |
|---|---|---|
| JP | 2002-510879 | 4/2002 |
| JP | 2010-40627 | 2/2010 |

(Continued)

*Primary Examiner* — Julio J Maldonado
*Assistant Examiner* — Moin Rahman
(74) *Attorney, Agent, or Firm* — Oblon, McClelland, Maier & Neustadt, L.L.P.

(57) ABSTRACT

In one embodiment, a semiconductor manufacturing apparatus includes an electrostatic chuck that includes a base and a first electrode provided on the base and is configured to electrostatically adsorb a wafer on the first electrode. The apparatus further includes a measurement module configured to measure potential of the wafer. The apparatus further includes a controller configured to adjust potential of the base based on the potential of the wafer and to adjust potential of the first electrode based on the potential of the wafer or the base, when the potential of the wafer measured by the measurement module changes.

16 Claims, 3 Drawing Sheets

(56) References Cited

U.S. PATENT DOCUMENTS

2014/0231389 A1\* 8/2014 Nagami ............ H01J 37/32091
216/67
2016/0035610 A1\* 2/2016 Park ................... H01L 21/6833
156/345.29

FOREIGN PATENT DOCUMENTS

| JP | 2011-238934 | 11/2011 |
| JP | 2013-157640 | 8/2013 |

\* cited by examiner

SEMICONDUCTOR MANUFACTURING APPARATUS AND METHOD OF OPERATING THE SAME

CROSS REFERENCE TO RELATED APPLICATION

This application is based upon and claims the benefit of priority from the prior Japanese Patent Application No. 2015-169673, filed on Aug. 28, 2015, the entire contents of which are incorporated herein by reference.

FIELD

Embodiments described herein relate to a semiconductor manufacturing apparatus and a method of operating the same.

BACKGROUND

For example, when a process target layer on a wafer is to be processed, the wafer is mounted on an electrostatic chuck (ESC) base through a high voltage (HV) electrode. In some cases, the process target layer, a first hard mask layer, a second hard mask layer and a resist layer are formed on the wafer, an opening that penetrates through the resist layer, the second hard mask layer and the first hard mask layer is formed by dry etching, and a portion of the process target layer within the opening is processed by dry etching.

In these cases, when the second hard mask layer is removed during the processing of the process target layer within the opening, the state of the wafer varies and the potential of the wafer is changed. Therefore, when the potential of the wafer is changed, a dry etching apparatus changes the potential of the ESC base to adjust the potential of the ESC base to be equal to the potential of the wafer. As a result, the potential difference between the wafer or ESC base and the HV electrode is changed, and a current flowing through the HV electrode increases. The increase of this current may adversely affect the dry etching.

DETAILED DESCRIPTION

Embodiments will now be explained with reference to the accompanying drawings.

In one embodiment, a semiconductor manufacturing apparatus includes an electrostatic chuck that includes a base and a first electrode provided on the base and is configured to electrostatically adsorb a wafer on the first electrode. The apparatus further includes a measurement module configured to measure potential of the wafer. The apparatus further includes a controller configured to adjust potential of the base based on the potential of the wafer and to adjust potential of the first electrode based on the potential of the wafer or the base, when the potential of the wafer measured by the measurement module changes.

First Embodiment

Figure 1:
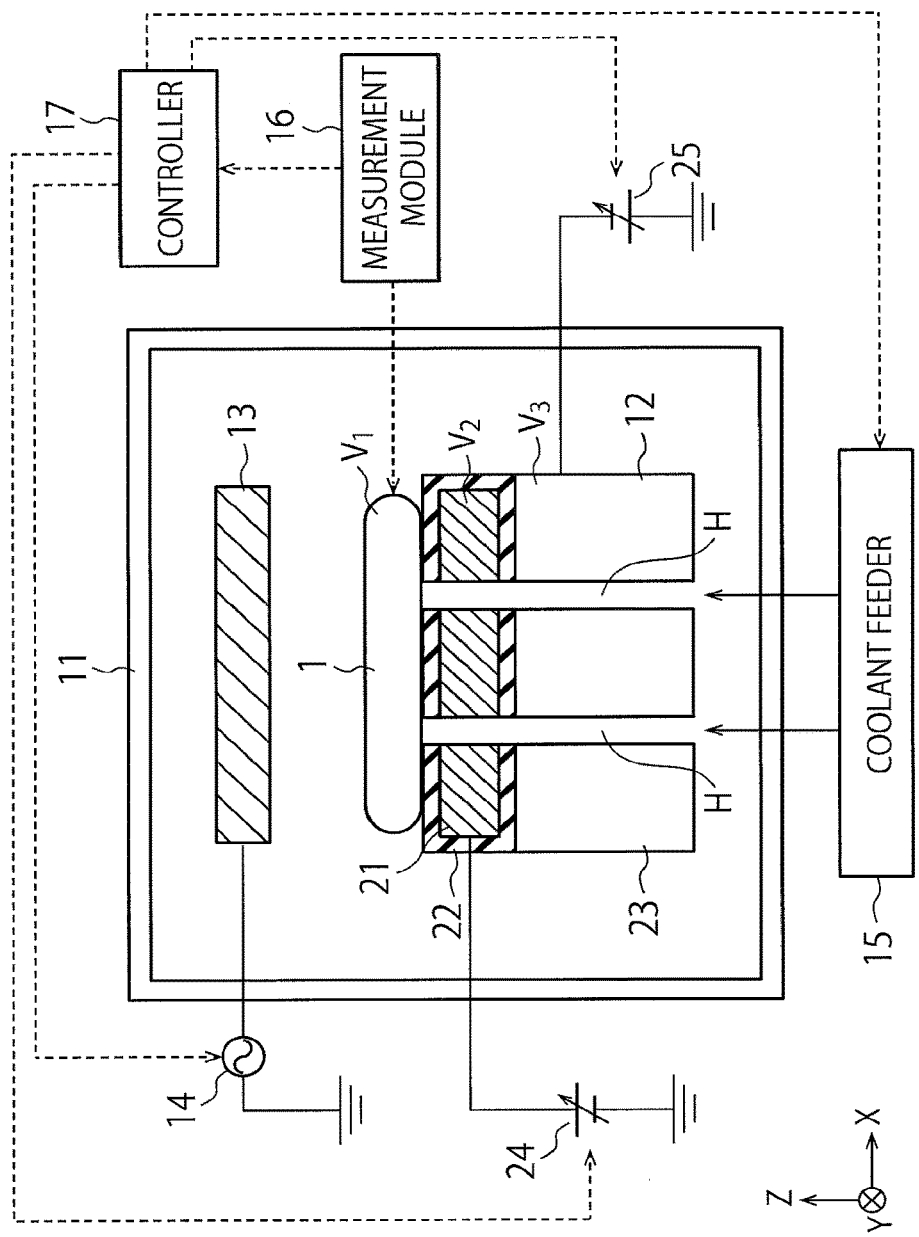
FIG. 1 is a cross-sectional view schematically illustrating a structure of a semiconductor manufacturing apparatus of a first embodiment.

FIG. 1 is a cross-sectional view schematically illustrating a structure of a semiconductor manufacturing apparatus of a first embodiment. The semiconductor manufacturing apparatus of FIG. 1 is a dry etching apparatus.

The semiconductor manufacturing apparatus of FIG. 1 includes a chamber 11, an ESC 12, an upper electrode 13, an AC power supply 14, a coolant feeder 15, a measurement module 16 and a controller 17. The ESC 12 further includes an HV electrode (lower electrode) 21, an insulator 22, an ESC base 23, an HV power supply 24 and an ESC power supply 25. The HV electrode 21 is an example of a first electrode, and the upper electrode 13 is an example of a second electrode.

The chamber 11 houses a wafer 1 to be processed by dry etching. An example of the wafer 1 is a semiconductor substrate such as a silicon substrate. FIG. 1 shows an X direction and a Y direction that are parallel to a surface of the wafer 1 and perpendicular to each other, and a Z direction that is perpendicular to the surface of the wafer 1. In this specification, a +Z direction is treated as an upward direction and a −Z direction is treated as a downward direction. The −Z direction in the present embodiment may or may not correspond to the direction of gravitational force.

Figure 2A:
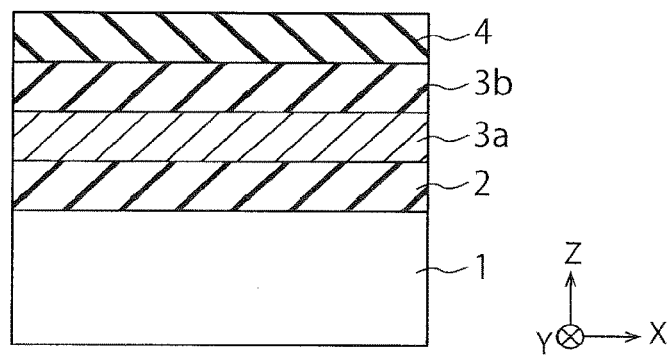
FIGS. 2A and 2B are cross-sectional views for describing operation of the semiconductor manufacturing apparatus of the first embodiment.
Figure 2B:
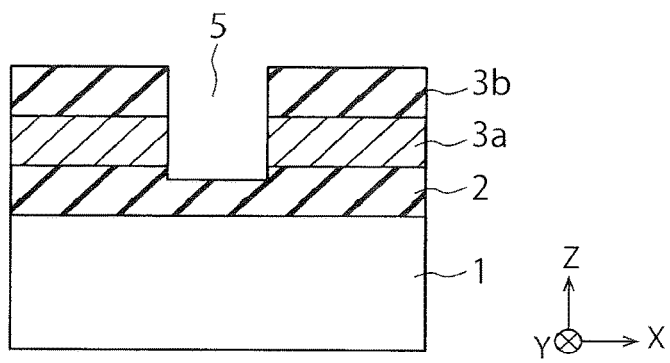

FIGS. 2A and 2B are cross-sectional views for describing operation of the semiconductor manufacturing apparatus of the first embodiment.

In the present embodiment, a process target layer 2, a first hard mask layer 3a, a second hard mask layer 3b and a resist layer 4 are formed on the wafer 1 (FIG. 2A), and the wafer 1 is then carried into the chamber 11, for example. The process target layer 2 may be directly formed on the wafer 1 or may be formed above the wafer 1 through another layer. An example of the process target layer 2 is a tetraethyl orthosilicate (TEOS) film. An example of the first hard mask layer 3a is a carbon film. An example of the second hard mask layer 3b is a spin on glass (SOG) film.

Next, an opening 5 that penetrates through the resist layer 4, the second hard mask layer 3b and the first hard mask layer 3a is formed by dry etching in the chamber 11 (FIG. 2B). An example of the dry etching is reactive ion etching (RIE). The resist layer 4 may be intentionally removed after the etching of the second hard mask layer 3b, or may be non-intentionally removed during the etching of the first hard mask layer 3a.

Next, a portion of the process target layer 2 within the opening 5 is processed by dry etching in the chamber 11, and the wafer 1 is then carried out of the chamber 11. When the portion of the process target layer 2 within the opening 5 is processed by the dry etching, the second hard mask layer 3b is also processed by this dry etching. Therefore, the second hard mask layer 3b is removed during the processing of the process target layer 2 within the opening 5, so that the state of the wafer varies.

Next, the description of the semiconductor manufacturing apparatus will be continued by referring again to FIG. 1.

The ESC 12 is used to support the wafer 1 in the chamber 11. The HV electrode 21 is covered with the insulator 22 and provided on the ESC base 23. The wafer 1 is mounted on the HV electrode 21 through the insulator 22. The ESC 12 electrostatically adsorbs the wafer 1 with the HV electrode 21. The wafer 1 can be moved up and down using a plurality of pins provided on the upper surface of the ESC 12.

Reference character $V_1$ denotes the potential of the wafer 1. Reference character $V_2$ denotes the potential of the HV electrode 21. Reference character $V_3$ denotes the potential of the ESC base 23. The HV power supply 24 is a variable voltage source used to adjust the potential $V_2$ of the HV electrode 21. The ESC power supply 25 is a variable voltage source used to adjust the potential $V_3$ of the ESC base 23.

The upper electrode 13 is located above the HV electrode 21. The semiconductor manufacturing apparatus of the present embodiment generates plasma between the HV electrode 21 and the upper electrode 13 to treat the wafer 1 with plasma. Specifically, the resist layer 4, the second hard mask layer 3b, the first hard mask layer 3a and the process target layer 2 are processed by dry etching using the plasma.

The AC power supply 14 supplies an AC current to the upper electrode 13. Consequently, the plasma is generated between the HV electrode 21 and the upper electrode 13.

The coolant feeder 15 feeds a coolant into holes H created in the HV electrode 21, the insulator 22 and the ESC base 23. Consequently, the wafer 1 is cooled with the coolant. An example of the coolant is a helium (He) gas. Although FIG. 1 shows only two holes H, the ESC 12 preferably includes three or more holes H.

The measurement module 16 measures the potential $V_1$ of the wafer 1 while the wafer 1 is treated with plasma. In other words, the potential $V_1$ of the wafer 1 is measured during dry etching. The potential $V_1$ of the wafer 1 measured by the measurement module 16 is output to the controller 17.

The controller 17 controls operation of the semiconductor manufacturing apparatus of the present embodiment. The controller 17 controls, for example, the operation of the chamber 11, the operation of the ESC 12, the on/off-state and the current of the AC power supply 14, the on/off-state and the feeding amount of the coolant of the coolant feeder 15, the voltage of the HV power supply 24, and the voltage of the ESC power supply 25.

In addition, the controller 17 adjusts the potential $V_3$ of the ESC base 23 based on the potential $V_1$ of the wafer 1 and adjusts the potential $V_2$ of the HV electrode 21 based on the potential $V_1$ of the wafer 1 or the potential $V_3$ of the ESC base 23, when the potential $V_1$ of the wafer 1 measured by the measurement module 16 changes. The potential $V_2$ of the HV electrode 21 can be adjusted by controlling the voltage of the HV power supply 24. The potential $V_3$ of the ESC electrode 23 can be adjusted by controlling the voltage of the ESC power supply 25. Details on such potential adjustments will be described later by referring to FIGS. 3 and 4.

Figure 3:
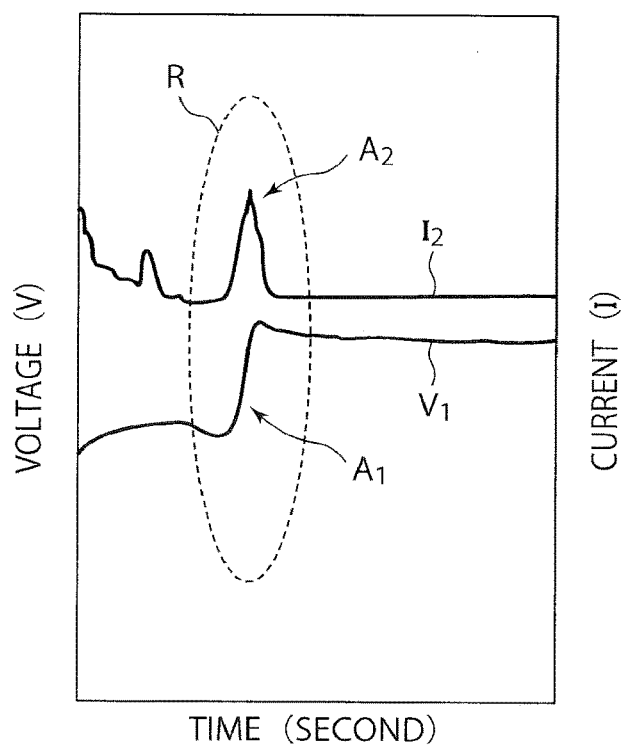
FIG. 3 is a graph for describing the operation of the semiconductor manufacturing apparatus of the first embodiment.

FIG. 3 is a graph for describing the operation of the semiconductor manufacturing apparatus of the first embodiment.

FIG. 3 shows the potential $V_1$ of the wafer 1 and a current $I_2$ flowing through the HV electrode 21. The axis of ordinates of FIG. 3 represents a voltage (V) and a current (A). The axis of abscissas of FIG. 3 represents time (second). Although the potential $V_1$ of the wafer 1 in the present embodiment is negative, FIG. 3 shows the absolute value of the potential $V_1$ of the wafer 1.

Reference character R represents a timing at which the second hard mask layer 3b is removed during the processing of the process target layer 2 within the opening 5. At this time, the state of the wafer 1 varies from a state where the second hard mask layer 3b exists to a state where the second hard mask layer 3b does not exist. As a result, the potential $V_1$ of the wafer 1 changes as shown by an arrow $A_1$. The reason for this is that the impedance of layers on the wafer 1 changes when the second hard mask layer 3b is removed.

Therefore, the controller 17 changes the potential $V_3$ of the ESC base 23 when the potential $V_1$ of the wafer 1 varies. Therefore, the controller 17 adjusts the potential $V_3$ of the ESC base 23 to be equal to the potential $V_1$ of the wafer 1. The reason for this is that abnormal electrical discharge may occur between the wafer 1 and the ESC base 23 if the difference between the potential $V_1$ and the potential $V_3$ is large. When the potential $V_3$ of the ESC base 23 is adjusted, a potential difference $V_2-V_1$ between the HV electrode 21 and the wafer 1 or a potential difference $V_2-V_3$ between the HV electrode 21 and the ESC base 23 varies. Accordingly, the current $I_2$ flowing through the HV electrode 21 increases as shown by an arrow $A_2$. In other words, a spike current $I_2$ is generated in the HV electrode 21.

An increase in the current $I_2$ may adversely affect dry etching. The controller 17 therefore retains the threshold of the current $I_2$ in a storage module. An example of the threshold is 75 μA. If the current $I_2$ exceeds the threshold, the controller 17 outputs an error signal and forcibly stops dry etching inside the chamber 11. It is preferable, however, to avoid such forced stop as much as possible.

Therefore, the controller 17 adjusts the potential $V_3$ of the ESC base 23 to be equal to the potential $V_1$ of the wafer 1, when the potential $V_1$ of the wafer 1 varies. In addition, the controller 17 adjusts the potential $V_2$ of the HV electrode 21 so that the potential difference $V_2-V_1$ between the wafer 1 and the HV electrode 21 becomes constant. For example, if the potential $V_1$ of the wafer 1 decreases by 1000 V, the controller 17 decreases the potential $V_3$ of the ESC base 23 by 1000 V and the potential $V_2$ of the HV electrode 21 by 1000 V as well. Consequently, it is possible to prevent an increase in the current $I_2$, thereby preventing the current $I_2$ from exceeding the threshold.

As described above, when the potential $V_1$ of the wafer 1 measured by the measurement module 16 changes, the controller 17 adjusts the potential $V_3$ of the ESC base 23 to a same value as the potential $V_1$, and adjusts the potential $V_2$ of the HV electrode 21 so that the potential difference $V_2-V_1$ becomes constant. The controller 17 can therefore control the current $I_2$ flowing through the HV electrode 21 so as not to exceed the threshold.

Furthermore, when the potential $V_1$ of the wafer 1 is changed, the controller 17 adjusts the potential $V_2$ of the HV electrode 21 so that the adsorption of the wafer 1 by the ESC 12 is maintained. The ESC 12 of the present embodiment can adsorb the wafer 1 by setting the potential difference $V_2-V_1$ between the wafer 1 and the HV electrode 21 to 1000 V or larger. Accordingly, the controller 17 adjusts the potential $V_2$ of the HV electrode 21 so that the potential difference $V_2-V_1$ is 1000 V or larger.

For example, before the potential $V_1$ of the wafer 1 changes, the potential $V_1$ of the wafer 1 is set to −2500 V, the potential $V_2$ of the HV electrode 21 is set to +2500 V, and the potential $V_3$ of the ESC base 23 is set to −2500 V. In this case, if the potential $V_1$ of the wafer 1 changes from −2500 V to −3500 V, the potential $V_2$ of the HV electrode 21 is adjusted from +2500 V to −2500 V or higher. Since the potential $V_2$ of the HV electrode 21 in the present embodiment is adjusted so that the potential difference $V_2-V_1$ becomes constant, the potential $V_2$ is adjusted from +2500 V to +1500 V. As a result, the potential difference $V_2-V_1$ is maintained at 5000 V.

Figure 4:
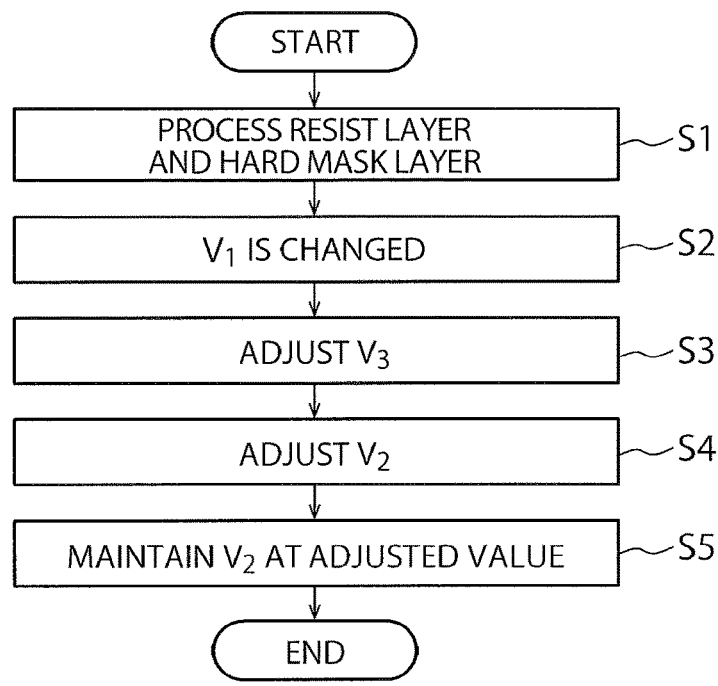
FIG. 4 is a flowchart illustrating a method of operating the semiconductor manufacturing apparatus of the first embodiment.

FIG. 4 is a flowchart illustrating a method of operating the semiconductor manufacturing apparatus of the first embodiment.

First, the resist layer 4, the second hard mask layer 3b and the first hard mask layer 3a are processed by dry etching in the chamber 11 (step S1). At this time, the potential $V_1$ of the wafer 1 is set to −2500 V, the potential $V_2$ of the HV electrode 21 is set to +2500 V, and the potential $V_3$ of the ESC base 23 is set to −2500 V.

Next, the potential $V_1$ of the wafer 1 is changed when the second hard mask layer 3b is removed during the processing of the process target layer 2 within the opening 5 (step S2). The measurement module 16 of the present embodiment measures the potential $V_1$ of the wafer 1 and outputs the result of measurement of the potential $V_1$ to the controller 17. Consequently, the controller 17 detects that the potential $V_1$ of the wafer 1 has changed from −2500 V to −3500 V. The value "−2500 V" of the potential $V_1$ is an example of a first value. The value "−3500 V" of the potential $V_1$ is an example of a second value.

Next, the controller 17 adjusts the potential $V_3$ of the ESC base 23 to the same value as the potential $V_1$ (step S3). As a result, the potential $V_3$ of the ESC base 23 is changed from −2500 V to −3500 V. Consequently, the potentials of the wafer 1 and the ESC base 23 can be equalized once again.

Next, the controller 17 adjusts the potential $V_2$ of the HV electrode 21 so that the potential difference $V_2-V_1$ becomes constant (step S4). As a result, the potential $V_2$ of the HV electrode 21 is changed from +2500 V to +1500 V. The value "+2500 V" of the potential $V_2$ is an example of a third value. The value "+1500 V" of the potential $V_2$ is an example of a fourth value. Consequently, it is possible to prevent an increase in the current $I_2$ flowing through the HV electrode 21.

Thereafter, the potential $V_1$ of the wafer 1 changes from −3500 V back to −2500 V. The controller 17 also changes the potential $V_3$ of the ESC base 23 from −3500 V back to −2500 V when a certain period of time elapses from when the potential $V_1$ has changed back to −2500 V. On the other hand, the controller 17 maintains the potential $V_2$ of the HV electrode 21 at the adjusted value "+1500 V" even if a certain period of time elapses from when the potential $V_1$ has changed back to −2500 V (step S5). The reason for this is that any large spike current $I_2$ is less likely to arise in the HV electrode 21 and the adsorption of the wafer 1 can be maintained, even if the potential $V_2$ is not changed back to the unadjusted value. A modified example of step S5 will be described in a second embodiment.

As described above, the controller 17 of the present embodiment adjusts the potential $V_3$ of the ESC base 23 based on the potential $V_1$ of the wafer 1 and adjusts the potential $V_2$ of the HV electrode 21 based on the potential $V_1$ of the wafer 1 or the potential $V_3$ of the ESC base 23, when the potential $V_1$ of the wafer 1 measured by the measurement module 16 changes. Specifically, the controller 17 of the present embodiment adjusts the potential $V_3$ of the ESC base 23 to the same value as the potential $V_1$, and adjusts the potential $V_2$ of the HV electrode 21 so that the potential difference $V_2-V_1$ ($=V_2-V_3$) becomes constant. Consequently, according to the present embodiment, it is possible to suppress the current $I_2$ flowing through the HV electrode 21.

Potential adjustments in the present embodiment can also be applied to wafers other than the wafer 1 in which the process target layer 2, the first hard mask layer 3a, the second hard mask layer 3b and the resist layer 4 are arranged. For example, the potential adjustments in the present embodiment can be applied to various cases where a spike current may arise due to a change in the impedance of layers on a wafer.

Although the potential difference $V_2-V_1$ between the wafer 1 and the HV electrode 21 is set to 1000 V or larger in the present embodiment, the lower limit 1000 V may be replaced with other values. For example, the lower limit of the potential difference $V_2-V_1$ may be set to a value dependent on the pressure of a coolant supplied from the coolant feeder 15, since the potential difference $V_2-V_1$ necessary to adsorb the wafer 1 may change depending on the pressure of the coolant.

In addition, the potential $V_3$ of the ESC base 23 may be adjusted to a value different from the potential $V_1$, instead of being adjusted to the same value as the potential $V_1$. For example, adjusting the potential $V_3$ to a value close to the potential $V_1$ makes it possible to obtain the same effect as in the case of adjusting the potential $V_3$ to the same value as the potential $V_1$.

Additionally, the potential $V_2$ of the HV electrode 21 may be adjusted so that the potential difference $V_2-V_1$ does not become constant, as long as the current $I_2$ of the HV electrode 21 can be controlled to less than the threshold. The potential $V_2$ may be adjusted so that the current $I_2$ does not change or changes to a value less than the threshold.

Second Embodiment

Figure 5:
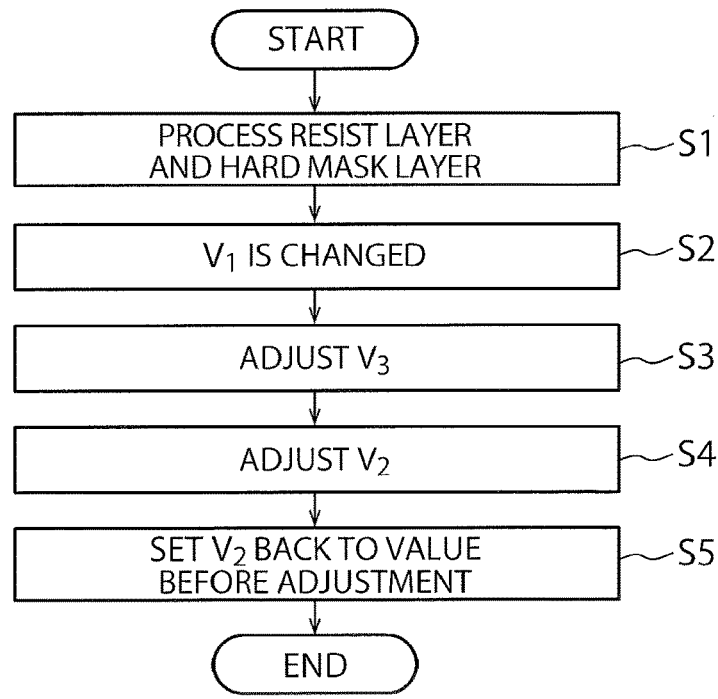
FIG. 5 is a flowchart illustrating a method of operating a semiconductor manufacturing apparatus of a second embodiment.

FIG. 5 is a flowchart illustrating a method of operating a semiconductor manufacturing apparatus of a second embodiment.

The structure of the semiconductor manufacturing apparatus of the present embodiment is the same as that of the semiconductor manufacturing apparatus of the first embodiment illustrated in FIG. 1. In addition, steps S1 to S4 shown in FIG. 5 are executed in the same way as steps S1 to S4 shown in FIG. 4.

In step S5 shown in FIG. 4, the controller 17 changes the potential $V_3$ of the ESC base 23 from −3500 V back to −2500 V when a certain period of time elapses from when the potential $V_1$ has changed back to −2500 V. However, the controller 17 maintains the potential $V_2$ of the HV electrode 21 at the adjusted value (i.e., value after adjustment) "+1500 V".

On the other hand, in step S5 shown in FIG. 5, the controller 17 changes the potential $V_3$ of the ESC base 23 from −3500 V back to −2500 V when a certain period of time elapses from when the potential $V_1$ has changed back to −2500 V, and changes the potential $V_2$ of the HV electrode 21 back to the unadjusted value (i.e., value before adjustment) "+2500 V". When the potential $V_2$ of the HV electrode 21 is to be changed back, the controller 17 preferably slowly changes back the potential $V_2$ so that the current $I_2$ of the HV electrode 21 does not exceed the threshold.

The ESC 12 of the present embodiment can adsorb the wafer 1 by setting the potential difference $V_2-V_1$ between the wafer 1 and the HV electrode 21 to 1000 V or larger. If the potential difference $V_2-V_1$ is too small, the ESC 12 fails to adsorb the wafer 12. On the other hand, too large a potential difference $V_2-V_1$ causes the problem of electrical discharge taking place in the wafer 1. Accordingly, the potential difference $V_2-V_1$ is preferably maintained at an appropriate setpoint. An example of such a setpoint is 5000 V.

According to step S5 in the present embodiment, the potential difference $V_2-V_1$ can be maintained at 5000 V by changing the potential $V_2$ of the HV electrode 21 back to +2500 V. On the other hand, according to step S5 in the first embodiment, the step of changing the potential $V_2$ of the HV electrode 21 back to +2500 V can be omitted to simplify step S5.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
an electrostatic chuck that includes a base and a first electrode provided on the base and is configured to electrostatically adsorb a wafer on the first electrode;
a measurement module configured to measure potential of the wafer; and
a controller configured to adjust potential of the base based on the potential of the wafer and to adjust potential of the first electrode based on the potential of the wafer or the base, when the potential of the wafer measured by the measurement module changes,
wherein
the controller changes the potential of the first electrode from a third value to a fourth value, when the potential of the wafer measured by the measurement module changes from a first value to a second value, and
the controller changes the potential of the first electrode from the fourth value back to the third value, when the potential of the wafer measured by the measurement module changes from the second value back to the first value.

2. The apparatus of claim 1, wherein the controller adjusts the potential of the base to a same value as the potential of the wafer, when the potential of the wafer measured by the measurement module changes.

3. The apparatus of claim 1, wherein the controller adjusts the potential of the first electrode so that a potential difference between the wafer and the first electrode becomes constant.

4. The apparatus of claim 1, wherein the controller controls a current flowing through the first electrode by adjusting the potential of the first electrode.

5. The apparatus of claim 1, wherein the controller adjusts the potential of the first electrode so that a current flowing through the first electrode does not exceed a threshold.

6. The apparatus of claim 1, wherein the controller adjusts the potential of the first electrode so that the adsorption of the wafer is maintained.

7. The apparatus of claim 1, wherein the controller adjusts the potential of the first electrode so that a potential difference between the wafer and the first electrode is 1000 V or larger.

8. The apparatus of claim 1, further comprising a second electrode configured to generate plasma between the first electrode and the second electrode and to treat the wafer with the plasma,
wherein the measurement module measures the potential of the wafer while the wafer is treated with the plasma.

9. A method of operating a semiconductor manufacturing apparatus, comprising:
mounting a wafer on a base of an electrostatic chuck through a first electrode;
electrostatically adsorbing the wafer with the electrostatic chuck;
measuring potential of the wafer with a measurement module; and
adjusting potential of the base based on the potential of the wafer and adjusting potential of the first electrode based on the potential of the wafer or the base, when the potential of the wafer measured by the measurement module changes,
wherein the method further comprises:
changing the potential of the first electrode from a third value to a fourth value, when the potential of the wafer measured by the measurement module changes from a first value to a second value, and
changing the potential of the first electrode from the fourth value back to the third value, when the potential of the wafer measured by the measurement module changes from the second value back to the first value.

10. The method of claim 9, wherein the potential of the base is adjusted to a same value as the potential of the wafer, when the potential of the wafer measured by the measurement module changes.

11. The method of claim 9, wherein the potential of the first electrode is adjusted so that a potential difference between the wafer and the first electrode becomes constant.

12. The method of claim 9, wherein a current flowing through the first electrode is controlled by adjusting the potential of the first electrode.

13. The method of claim 9, wherein the potential of the first electrode is adjusted so that a current flowing through the first electrode does not exceed a threshold.

14. The method of claim 9, wherein the potential of the first electrode is adjusted so that the adsorption of the wafer is maintained.

15. The method of claim 9, wherein the potential of the first electrode is adjusted so that a potential difference between the wafer and the first electrode is 1000 V or larger.

16. The method of claim 9, further comprising generating plasma between the first electrode and a second electrode and treating the wafer with the plasma,
wherein the potential of the wafer is measured by the measurement module while the wafer is treated with the plasma.

* * * * *